US011675030B2

(12) United States Patent
Higgins et al.

(10) Patent No.: US 11,675,030 B2
(45) Date of Patent: Jun. 13, 2023

(54) AUTO-HEMISPHERE DETECTION IN A MAGNETIC TRACKER

(71) Applicant: ALKEN Inc., Colchester, VT (US)

(72) Inventors: Robert F. Higgins, South Burlington, VT (US); Henry E. Himberg, South Burlington, VT (US); Allan G. Rodgers, Jr., Waterbury, VT (US)

(73) Assignee: ALKEN Inc., Colchester, VT (US)

( * ) Notice: Subject to any disclaimer, the term of this patent is extended or adjusted under 35 U.S.C. 154(b) by 0 days.

(21) Appl. No.: 17/866,951

(22) Filed: Jul. 18, 2022

(65) Prior Publication Data
US 2023/0036210 A1 Feb. 2, 2023

Related U.S. Application Data

(60) Provisional application No. 63/226,522, filed on Jul. 28, 2021.

(51) Int. Cl.
*G01R 33/28* (2006.01)
(52) U.S. Cl.
CPC .................... *G01R 33/28* (2013.01)
(58) Field of Classification Search
None
See application file for complete search history.

(56) References Cited

U.S. PATENT DOCUMENTS

| 6,980,921 | B2 | 12/2005 | Anderson et al. | |
| 8,652,077 | B2 | 2/2014 | Centen | |
| 9,703,002 | B1 | 7/2017 | Olsson et al. | |
| 10,830,572 | B2 | 11/2020 | Chung et al. | |
| 11,326,905 | B1* | 5/2022 | Himberg | G01D 5/22 |
| 11,543,529 | B1* | 1/2023 | Higgins | G01S 17/66 |
| 2005/0062469 | A1 | 3/2005 | Anderson | |
| 2020/0027275 | A1 | 1/2020 | Wan | |
| 2021/0386485 | A1* | 12/2021 | Schneider | G01D 5/12 |

FOREIGN PATENT DOCUMENTS

EP 3676962 B1 11/2020

* cited by examiner

*Primary Examiner* — Rodney E Fuller
(74) *Attorney, Agent, or Firm* — Lerner David LLP

(57) ABSTRACT

An apparatus and method for determining position and orientation (PnO) of an object within an environment and for automatically determining a hemisphere of the object relative to a source location using an electromagnetic tracking system and a non-magnetic tracking device. The method involves seeding two candidate PnO solutions, one in each hemisphere, based on initial data from the magnetic tracker. Then, as the sensor moves within the tracking volume, both the magnetic tracker and the non-magnetic tracking device are used to track changes in each of the candidate PnO solutions and to determine a correct one of the candidate PnO solutions.

27 Claims, 5 Drawing Sheets

AUTO-HEMISPHERE DETECTION IN A MAGNETIC TRACKER

CROSS-REFERENCE TO RELATED APPLICATIONS

The present application claims the benefit of the filing date of U.S. Provisional Patent Application No. 63/226,522 filed Jul. 28, 2021, the disclosure of which is hereby incorporated herein by reference.

TECHNICAL FIELD

The present disclosure generally relates to electromagnetic tracking systems.

BACKGROUND

An electromagnetic (EM) tracking system determines position and orientation (PnO) of a tracked object using measurements of a multi-dimensional magnetic field generated by the system. The system applies knowledge of the magnetic field structure to determine the PnO of its respective sensors within the tracking volume. This provides high performance tracking in terms of measurement rate, accuracy, repeatability, and precision. Magnetic trackers often use dipole magnetic fields because the well-known physical structure leads to a closed form mathematical solution. In this type of tracker, the magnetic source is typically the reference and a magnetic sensor's position, and orientation is then calculated relative to the magnetic source.

Because the dipole field emitted from the magnetic source is symmetrical, the magnetic field on one side of the source at a particular location is the same as the field on the opposite side of the source. The opposite sides of the source are typically referred to as hemispheres. Since the source is the reference for position, this symmetry leads to the tracker yielding two equally valid position solutions: one within each hemisphere. To determine which of the two equally valid solutions is the correct solution, it must be determined in which hemisphere the sensor is operating. As a result, pre-knowledge of the hemisphere in which the sensor is located relative to the source is required prior to the system conducting measurements and tracking the sensor. Ascertaining the correct hemisphere and inputting the hemisphere into the system can be inconvenient, and at times impractical, for the user. Moreover, if the user makes a mistake and enters the incorrect hemisphere, the tracker will not operate properly.

SUMMARY

The present disclosure describes a system and method for automatically determining a hemisphere of the sensor relative to the source. The system includes both the magnetic tracker and a non-magnetic tracking device that is not subject to hemisphere ambiguity. The method begins by seeding two candidate PnO solutions, one in each hemisphere, based on initial data from the magnetic tracker. Then, as the sensor moves within the tracking volume, both the magnetic tracker and the non-magnetic tracking device are independently used to track changes in each of the candidate PnO solutions. Thus, each hemisphere is associated with a pair of PnO solutions for that hemisphere: one magnetic solution and one non-magnetic solution. The pair of solutions that diverges by a greater amount is determined to be in the incorrect hemisphere, whereas the pair of solutions that does not diverge or diverges by a lesser amount is determined to be in the correct hemisphere.

One aspect of the disclosure is directed to a method for tracking a position and orientation (PnO) of a first object within a tracking environment according to a first frame of reference defined by a second object, the method including: (a) receiving, by one or more processors, one or more first magnetic PnO data signals from a magnetic tracking subsystem; (b) determining, by the one or more processors, each of a first magnetic candidate PnO solution and a second magnetic candidate PnO solution of the first object within the tracking environment based on the first magnetic PnO data signal; (c) setting, by the one or more processors, a first non-magnetic PnO value to correspond to the first magnetic candidate PnO solution and a second non-magnetic PnO value to correspond to the second magnetic candidate PnO solution; (d) after setting the first and second non-magnetic PnO values, receiving, by the one or more processors, each of: (i) one or more second magnetic PnO data signals from the magnetic tracking subsystem and (ii) one or more non-magnetic tracking signals from a non-magnetic tracking subsystem indicative of a movement of the first object within the tracking environment according to a second frame of reference; (e) determining, by the one or more processors, each of the first magnetic candidate PnO solution and the second magnetic candidate PnO solution of the first object within the tracking environment based on the second magnetic PnO data signal; (f) adjusting, by the one or more processors, each of the first and second non-magnetic PnO values based on the one or more non-magnetic tracking signals; (g) calculating, by the one or more processors, a first difference between the first magnetic candidate PnO solution determined based on the second magnetic PnO data signal and the adjusted first non-magnetic PnO value; (h) calculating, by the one or more processors, a second difference between the second magnetic candidate PnO solution determined based on the second magnetic PnO data signal and the adjusted second non-magnetic PnO value; (i) determining, by the one or more processors, which of the first difference or the second difference is indicative of divergence between its respective magnetic candidate PnO solution and non-magnetic PnO value; and (j) setting, by the one or more processors, a final magnetic PnO solution of the first object: to the first magnetic candidate PnO solution in response to the second difference being indicative of divergence between the second magnetic candidate PnO solution and the adjusted second non-magnetic PnO value; or to the second magnetic candidate PnO solution in response to the first difference being indicative of divergence between the first magnetic candidate PnO solution and the adjusted first non-magnetic PnO value.

In some examples, the method may further include: determining, by the one or more processors, whether the first object is stationary or in motion at a time associated with the one or more first magnetic PnO data signals; and either: in response to determining that the first object is stationary, setting, by the one or more processors, an initial velocity of the first object at zero; or in response to determining that the first object is in motion, setting, by the one or more processors, the initial velocity of the first object based on the one or more non-magnetic tracking signals.

In some examples, adjusting each of the first and second non-magnetic PnO values may involve: determining at least one of a linear motion or an angular motion of the first object based on the one or more non-magnetic tracking signals and the set initial velocity; and adjusting each of the first and second non-magnetic PnO values based on the determined linear motion and/or angular motion, wherein each of the first and second non-magnetic PnO values may be adjusted by a same amount.

In some examples, the first magnetic candidate PnO solution and the second magnetic candidate PnO solution may be coordinates in opposite hemispheres of the tracking environment.

In some examples, determining which of the first difference or the second difference is indicative of diverging magnetic candidate PnO solution and non-magnetic PnO values may involve determining which of the first difference or the second difference is increasing. In some examples, the method may further include detecting motion of the first object based on the one or more non-magnetic tracking signals, wherein calculating the first difference and the second difference may be performed after motion of the first object is detected.

In some examples, determining which of the first difference or the second difference is indicative of diverging magnetic candidate PnO solution and non-magnetic PnO values may involve determining which of the first difference or the second difference is greater. In some examples, the final magnetic PnO solution of the first object may be set: to the first magnetic candidate PnO solution in response to the second difference being greater than the first difference; or to the second magnetic candidate PnO solution in response to the first difference being greater than the second difference.

In some examples, the final magnetic PnO solution of the first object may be set: (i) to the first magnetic candidate PnO solution in response to the second difference being greater than or equal to the first difference by a threshold amount, or (ii) to the second magnetic candidate PnO solution in response to the first difference being greater than or equal to the second difference by the threshold amount.

In some examples, the method may further include repeating, by the one or more processors, steps (d)-(j) in response to an absolute value of the first and second differences being less than the threshold amount.

In some examples, the one or more non-magnetic tracking signals may be indicative of at least one of a translation or rotation of the first object relative to the second object.

In some examples, the one or more non-magnetic tracking signals may be received from one of: an inertial sensor, an optical sensor, an acoustic sensor, a radio frequency (RF) sensor, a barometer, a GPS receiver, a radar chip, or a magnetometer.

In some examples, the method may further include outputting the final magnetic PnO solution of the first object.

In some examples, each of the first magnetic PnO data signals and the second magnetic PnO data signals may be received from a plurality of sensing elements of the electromagnetic tracking system operative to detect magnetic fields emitted by a plurality of transmission coils of the electromagnetic tracking system along different axes. In some examples, the method may further include: emitting, by the plurality of transmission coils of the electromagnetic tracking system, respective magnetic fields; and detecting, by the plurality of sensing elements of the electromagnetic tracking system, the emitted magnetic fields.

Another aspect of the present disclosure is directed to an apparatus for tracking a position and orientation (PnO) of a first object within a tracking environment according to a first frame of reference defined by a second object, the apparatus comprising: memory for storing instructions; and one or more processors for executing the instructions. The instructions stored in the memory may be configured to cause the one or more processors to: receive one or more first magnetic PnO data signals from a magnetic tracking subsystem; determine each of a first magnetic candidate PnO solution and a second magnetic candidate PnO solution of the first object within the tracking environment based on the first magnetic PnO data signal; set a first non-magnetic PnO value to correspond to the first magnetic candidate PnO solution and a second non-magnetic PnO value to correspond to the second magnetic candidate PnO solution; after setting the first and second non-magnetic PnO values, receive each of: (i) one or more second magnetic PnO data signals from the magnetic tracking subsystem and (ii) one or more non-magnetic tracking signals from a non-magnetic tracking subsystem indicative of a movement of the first object within the tracking environment according to a second frame of reference; determine each of the first magnetic candidate PnO solution and the second magnetic candidate PnO solution of the first object within the tracking environment based on the second magnetic PnO data signal; adjust each of the first and second non-magnetic PnO values based on the one or more non-magnetic tracking signals; calculate a first difference between the first magnetic candidate PnO solution determined based on the second magnetic PnO data signal and the adjusted first non-magnetic PnO value; calculate a second difference between the second magnetic candidate PnO solution determined based on the second magnetic PnO data signal and the adjusted second non-magnetic PnO value; determine which of the first difference or the second difference is indicative of divergence between its respective magnetic candidate PnO solution and non-magnetic PnO value; and set a final magnetic PnO solution of the first object: (i) to the first magnetic candidate PnO solution in response to the second difference being indicative of divergence between the second magnetic candidate PnO solution and the adjusted second non-magnetic PnO value, or (ii) to the second magnetic candidate PnO solution in response to the first difference being indicative of divergence between the first magnetic candidate PnO solution and the adjusted first non-magnetic PnO value.

In some examples, the instructions may be further configured to cause the one or more processors to: determine a motion of the first object at a time associated with the one or more first magnetic PnO data signals; and set an initial velocity of the first object based on the determined motion of the first object.

In some examples, the first magnetic candidate PnO solution and the second magnetic candidate PnO solution may be coordinates in opposite hemispheres of the tracking environment.

In some examples, the instructions may be further configured to cause the one or more processors to determine which of the first difference or the second difference is increasing.

In some examples, the instructions may be further configured to cause the one or more processors to detect motion of the first object based on the one or more non-magnetic tracking signals, and calculate the first difference and the second difference after motion of the first object is detected.

In some examples, the instructions may be further configured to cause the one or more processors to determine which of the first difference or the second difference is greater, wherein the final magnetic PnO solution of the first object is set to the first magnetic candidate PnO solution in response to the second difference being greater than the first difference, and to the second magnetic candidate PnO solution in response to the first difference being greater than the second difference.

In some examples, the instructions may be configured to cause the one or more processors to set the final magnetic PnO solution: to the first magnetic candidate PnO solution in response to the second difference being greater than or equal to the first difference by a threshold amount; or to the second magnetic candidate PnO solution in response to the first difference being greater than or equal to the second difference by the threshold amount.

In some examples, the instructions may be configured to repeatedly: receive new magnetic PnO data signals and non-magnetic tracking signals, calculate the first and second differences based on the received new magnetic PnO data signals and non-magnetic tracking signals, and determine which of the first difference or the second difference is greater until the absolute value of the first and second differences is greater than or equal to the threshold amount.

In some examples, the one or more non-magnetic tracking signals may be indicative of at least one of a translation or rotation of the first object relative to the second object.

In some examples, the apparatus may further include: the non-magnetic tracking subsystem; a receiver circuit including a plurality of receiver elements aligned at different receiver axes, each receiver element configured to detect a magnetic field along its respective axis; and a transmitter circuit including a plurality of transmission elements aligned at different transmitter axes, each transmission coil configured to emit a magnetic field along its respective axis, wherein the plurality of receiver elements are operative to detect magnetic fields emitted by the transmission coils along their respective axes and generate corresponding magnetic PnO data signals for each component of the detected magnetic field.

BRIEF DESCRIPTION OF THE DRAWINGS

The foregoing aspects, features and advantages of the present disclosure will be further appreciated when considered with reference to the following description of exemplary embodiments and accompanying drawings, wherein like reference numerals represent like elements. In describing the exemplary embodiments of the present disclosure illustrated in the drawings, specific terminology may be used for the sake of clarity. However, the aspects of the present disclosure are not intended to be limited to the specific terms used.

DETAILED DESCRIPTION

Figure 1:
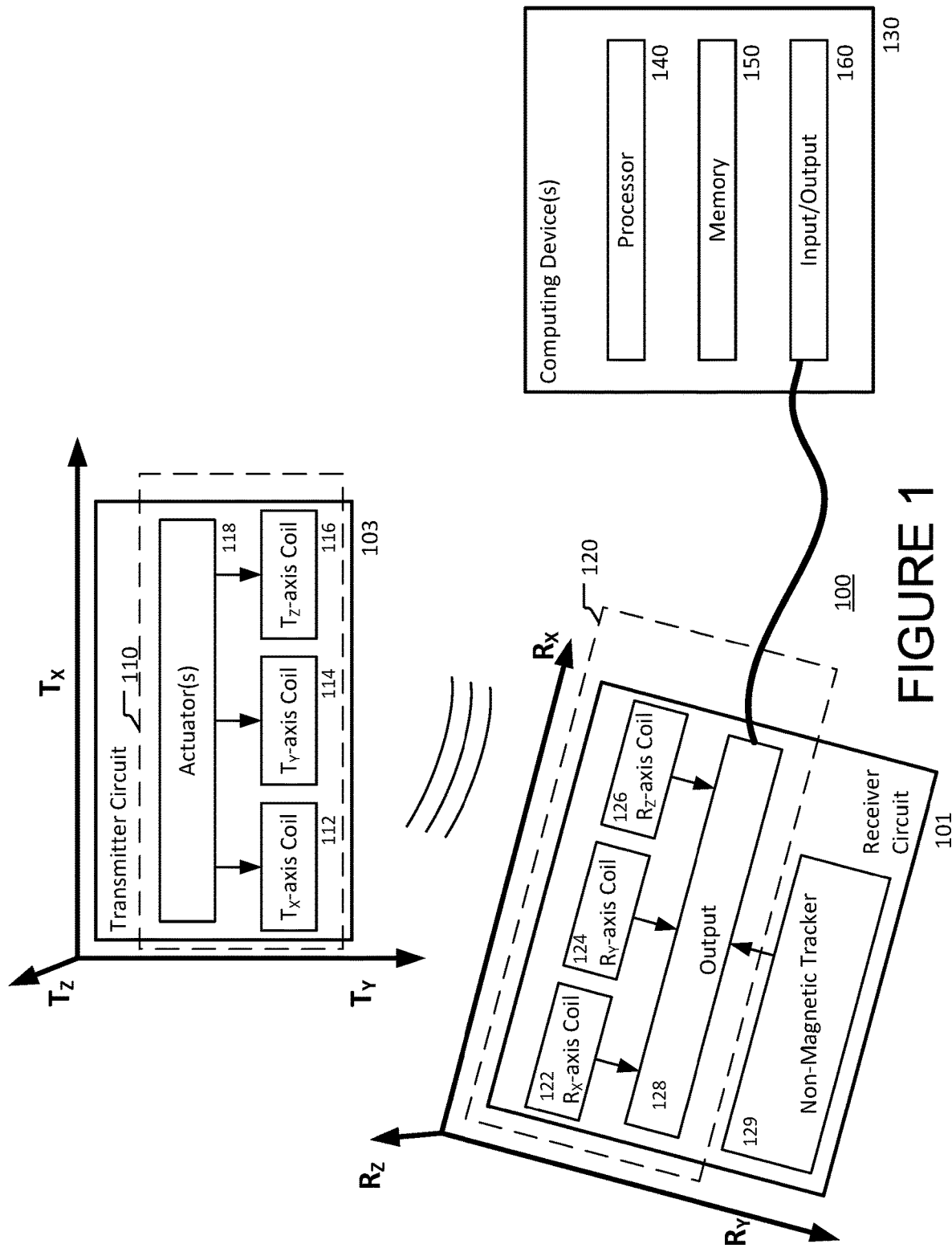
FIG. 1 is a block diagram of an electromagnetic tracking system in accordance with an embodiment of the present disclosure.

FIG. 1 is a block diagram illustrating a system 100 for tracking the position and orientation (PnO) of a first object 101 that is freely movable relative to a second object 103. The system 100 includes each of an electromagnetic tracking system and a non-magnetic tracking system. Each system may be independently capable of tracking a position and/or orientation (PnO) of the first object 101. The PnO of the first object may be characterized in terms of a frame of reference defined by the second object 103. Thus, the PnO of the first object 101 is tracked relative to the second object 103.

The electromagnetic tracking system includes a transmitter circuit 110 for generating an electromagnetic field, and a receiver circuit 120 for sensing the generated electromagnetic field and generating electrical signals based on the sensed electromagnetic field.

In the example of FIG. 1, the transmitter circuit 110 includes a transmitter coil array having a plurality of transmitter coils 112, 114, 116 physically mounted to a second object 103. The transmitter coils are aligned along axes of the transmitter, respectively. In FIG. 1, these axes are denoted $T_X$, $T_Y$ and $T_Z$. The $T_X$, $T_Y$ and $T_Z$ axes may be orthogonal to one another, or they may be different from one another without being orthogonal. Generally, the axes do not all extend within a common plane so that the axes form a three-dimensional frame of reference or coordinate system.

The transmitter circuit 110 may further include an actuating circuit 118 configured to actuate the transmitter coils at different times or different frequencies. The actuating circuit 118 may include one or more frequency generators for generating one or more alternating signals. A different frequency signal may be provided to a respective driver for driving each coil, respectively. Alternatively, the same alternating signal may be input to a multiplexer which is timed by a clock included in the transmitter, and outputs of the multiplexer may be provided to the respective drivers at different times. The drivers may further include additional components for driving the coils, such as one or more amplifier circuits. The alternating signal applied to each coil causes the coil to produce an electromagnetic field. Because the driving signals differ from one another in frequency, timing, or both, the fields produced by the various coils also differ from one another. The electromagnetic field produced by the coils may be symmetrical. For instance, the electromagnetic field may be a dipole field having axis of symmetry and two symmetrical sides or hemispheres on either side of the axis of symmetry. Thus, every location within the tracking volume of the system can be characterized as being in one of the two hemispheres of the electromagnetic field.

In the example of FIG. 1, the receiver circuit 120 includes a receiver coil array having a plurality of receiver coils 122, 124, 126 mounted to a first object 101 aligned along axes of the receiver circuit, respectively. In FIG. 1, these axes are denoted $R_X$, $R_Y$ and $R_Z$. The $R_X$, $R_Y$ and $R_Z$ axes are fixed relative to the first object 101. As with the transmitter axes, the receiver axes may be orthogonal to one another, or may be different from one another without being orthogonal, but generally form a three-dimensional coordinate system (e.g., do not all extend within a common plane).

Since the receiver coils can be oriented independent of the transmitter coils, it should be understood that the $R_X$, $R_Y$ and $R_Z$ axes of the receiver coil typically are not aligned with the $T_X$, $T_Y$, $T_Z$ axes of the transmitter circuit. Thus, the PnO determined by the electromagnetic tracking system may be characterized in terms of a position and an orientation of the axes of the receiver circuit relative to the axes of the transmitter coils. In this regard, the movement in position or orientation of one or more transmitter coils relative to the receiver coils, or one or more receiver coils relative to the transmitter coils, will influence the PnO solution derived by the system. As such, the transmitter coils and receiver coils are referred to herein as "active elements," whereby the transmitter coils 112, 114 and 116 form one set of active elements of the magnetic locating system, and the receiver coils 122, 124 and 126 form another set of active elements of the magnetic locating system.

The electromagnetic fields generated by the transmitter circuit 110 cause alternating electric current to be generated in the windings of the receiver coils 122, 124, 126. The alternating electric current in each receiver coil typically includes multiple components. Each component is caused by the field generated by one of the transmitter coils. Because the fields generated by the transmitter coils differ from one another in timing, frequency or both, the components of the current in each receiver coil also differ from one another. The system includes conventional elements (not shown) for separating the components of the current in each. The components of the current in coil 122 include a component referred to as $T_X R_X$, representing the current in $R_X$ receiver coil 122 resulting from the field generated by $T_X$ transmitter coil 112; another component $T_Y R_X$ representing the current in $R_X$ receiver coil 122 resulting from the field generated by $T_Y$ transmitter coil 114, and a further component $T_Z R_X$ representing the current in $R_X$ receiver coil 122 resulting from the field generated by $T_Z$ transmitter coil 116. Similarly, the components of the current in $R_Y$ receiver coil 124 include components $T_X R_Y$, $T_Y R_Y$ and $T_Z R_Y$, and the components of the current in $R_Z$ receiver coil 126 include components $T_X R_Z$, $T_Y R_Z$ and $T_Z R_Z$.

In the case of a time-division based transmission, the timing of the electric currents may indicate which of the transmitter coils 112, 114, 116 generated the electromagnetic fields that resulted in the electric current. The system may include a conventional separation circuit synchronized to the timing of the transmitter circuit to separate the components according to the time they are received. In the case of a frequency-division based transmission, the separation circuit may include analog or digital frequency-selective filters. The separation circuit may be provided as part of the receiver circuit 120, or may be included in one or more computing devices 130 discussed herein.

The non-magnetic tracking system includes one or more active elements, at least one of which is depicted in FIG. 1 as a tracking device in the form of block 129. The non-magnetic tracking device 129 may be a conventional inertial locating device including a set of active elements such as linear acceleration sensors and gyroscopic sensors (not shown). In the example of FIG. 1, the device 129 is put in a fixed position relative to the active elements of the receiver circuit 120 of the electromagnetic tracking system. Preferably, the active elements of the non-magnetic tracking device 129 are co-located with the receiver coils, so that a movement of the receiver circuit 120 corresponds to a movement of the non-magnetic tracking device 129. For instance, the device 129 may be mounted on the first object 101 along with the receiver coils 122, 124, 126. In other examples, the non-magnetic tracking system may include one or more other devices having other active elements for monitoring movement of the second object 103, which may or may not be a moving frame of reference (as, for example, if the second object 103 is mounted in a vehicle that may or may not be in motion). Desirably, the non-magnetic tracking system estimates a motion of the first object 101 relative to the second object 103.

Motion data derived from the non-magnetic tracking device 129 may be indicative of translation, rotation, or a combination thereof. For instance, the non-magnetic tracking device 129 may include an inertial measurement unit (IMU) having accelerometers and gyroscopes for tracking changes in position and orientation of the receiver circuit and, by extension, tracked object. Positional acceleration data and rotational velocity data from the IMU may be processed to determine translation and rotation of the tracked object.

In further embodiments, the non-magnetic tracking system may include any one or combination of gyroscopes, accelerometers, barometers, optical sensors and transmitters, acoustic sensors and transmitters, radio frequency (RF) sensors and transmitters, global positioning system (GPS) receivers, radar chips, magnetometers, and other non-magnetic technologies and devices for tracking position and/or orientation of one object relative to another object. For purposes of the present disclosure, the non-magnetic tracking device may additionally or alternatively include magnet-based sensors that do not rely on an electromagnetic transmitter circuit for its sensor readings and that are not sensitive to local electromagnetic distortions within the tracking environment, such as a magnetometer for sensing a magnetic field polarity (such as a magnetic field of the Earth). Each of the active elements of the non-magnetic tracking device may be capable of tracking a motion of the tracked object, in terms of position, orientation, or a combination thereof.

Motion of the tracked object may be determined by the non-magnetic tracking system independent of the determinations made by the electromagnetic tracking system. More specifically, the motion of the tracked object may be determined by the non-magnetic tracking system independent of the electromagnetic field generated by the electromagnetic tracking system. This means that the non-magnetic tracking system operates correctly without requiring knowledge of which hemisphere of the electromagnetic field the tracked object is located in.

Each of the electromagnetic tracking system and the non-magnetic tracking system may be connected to one or more computing devices 130 included in the system electronics in order to transmit and receive data with the computing devices. For example, in FIG. 1, the receiver circuit 120 includes an output circuit 128 for receiving generated electric currents and providing the currents as electrical signals to one or more computing devices 130. The output to the computing devices 130 may be an analog or digital signal, depending on the available hardware and software included in each of the output circuit 128 and the computing devices 130.

The non-magnetic tracking device 129 is also connected to the one or more computing devices 130 included in the system electronics in order to transmit and receive data with the computing devices 130. The one or more computing devices 130 are configured to receive and process the electrical signals generated by active elements included in or mounted to the first object 101, which includes the receiver circuit 120 and non-magnetic tracking device 129. In the example of FIG. 1, the connection between the magnetic and non-magnetic active elements and the one or more computing devices 130 is shown as a wired connection using a cable, such as a USB Type-C cable. Other cables typically used in electromagnetic tracking systems, or wireless connections, including short range communication protocols such as near-field communication (NFC), WiFi, Bluetooth, Bluetooth LE, may be used. Additionally or alternatively, the transmitter circuit and the receiver circuit may be connected to one another in a wired or wireless manner in order to provide information there between, such as providing phase information from the transmitter to the receiver to avoid phase ambiguity of the electromagnetic field generated by the transmitter.

The magnetic and non-magnetic tracking systems may be configured to ensure that data collected at the same time by the respective systems is compared to one another at the one or more computing devices 130. This may involve wiring the magnetic and non-magnetic systems together to synchronize data collection and transmission, providing time signatures with the collected data, or some combination thereof.

The one or more computing devices 130 of the system electronics may include a processor 140, memory 150, and other components typically present in general-purpose computers. The computing devices 130 may further include one or more input/output connections 160 for sending and receiving data from the transmitter circuit, receiver circuit, non-magnetic tracker, or any combination thereof.

The processor 140 may be a well-known processor or other lesser-known types of processors. Alternatively, the processor 140 can be a dedicated controller such as an ASIC. The memory 150 can store information accessible by the processor 140, including data that can be retrieved, manipulated or stored by the processor 140, in accordance with instructions stored in the memory. The memory 150 may be a type of non-transitory computer readable medium capable of storing information accessible by the processor 140, such as a hard-drive, solid state drive, tape drive, optical storage, memory card, ROM, RAM, DVD, CD-ROM, write-capable, and read-only memories.

Although the system described herein is not limited by a particular data structure, the data may be stored in computer registers, in a data store as a structure having a plurality of different fields and records, or documents, or buffers. The data may also be formatted in a computer-readable format such as, but not limited to, binary values, ASCII or Unicode. Moreover, the data can include information sufficient to identify relevant information, such as numbers, descriptive text, proprietary codes, pointers, references to data stored in other memories, including other network locations, or information that is used by a function to calculate relevant data. The instructions may be a set of instructions executed directly, such as machine code, or indirectly, such as scripts, by the processor 140. In this regard, the terms "instructions," "steps," "programs" and "routines" can be used interchangeably herein. The instructions can be stored in object code format for direct processing by the processor 140, or other types of computer language including scripts or collections of independent source code modules that are interpreted on demand or compiled in advance.

Although FIG. 1 functionally illustrates the processor 140 and memory 150 as being within the same computing device block 130, the processor 140 and memory 150 may actually include multiple processors and memories that may or may not be stored within the same physical housing. For example, some of the data 170 and instructions 180 may be stored on a removable CD-ROM and others within a read-only computer chip. Some or all of the instructions and data can be stored in a location physically remote from, yet still accessible by, the processor 140. Similarly, the processor 140 can actually include a collection of processors, which may or may not operate in parallel.

Additionally, the computing device 130 in FIG. 1 is shown as a single block, although it should be appreciated that computing device components may be provided separately from one another or in separate components. For example, the processor 140 may represent multiple processors included in different computing devices and communicatively connected to one another by one or more wired or wireless connections. Additionally or alternatively, data or instructions of the memory may be stored in different computing devices and communicatively connected by one or more wired or wireless connections. For instance, the computing device may include memory 150 storing a database, may be connected to a remote memory storing a database, or both, for the purpose of storing information derived by the processor 140 of the computing device 130. The database may be useful for logging a PnO of the first object 101 over a duration of time, whereby the logged data can be accessed and evaluated at a later time.

Figure 2:
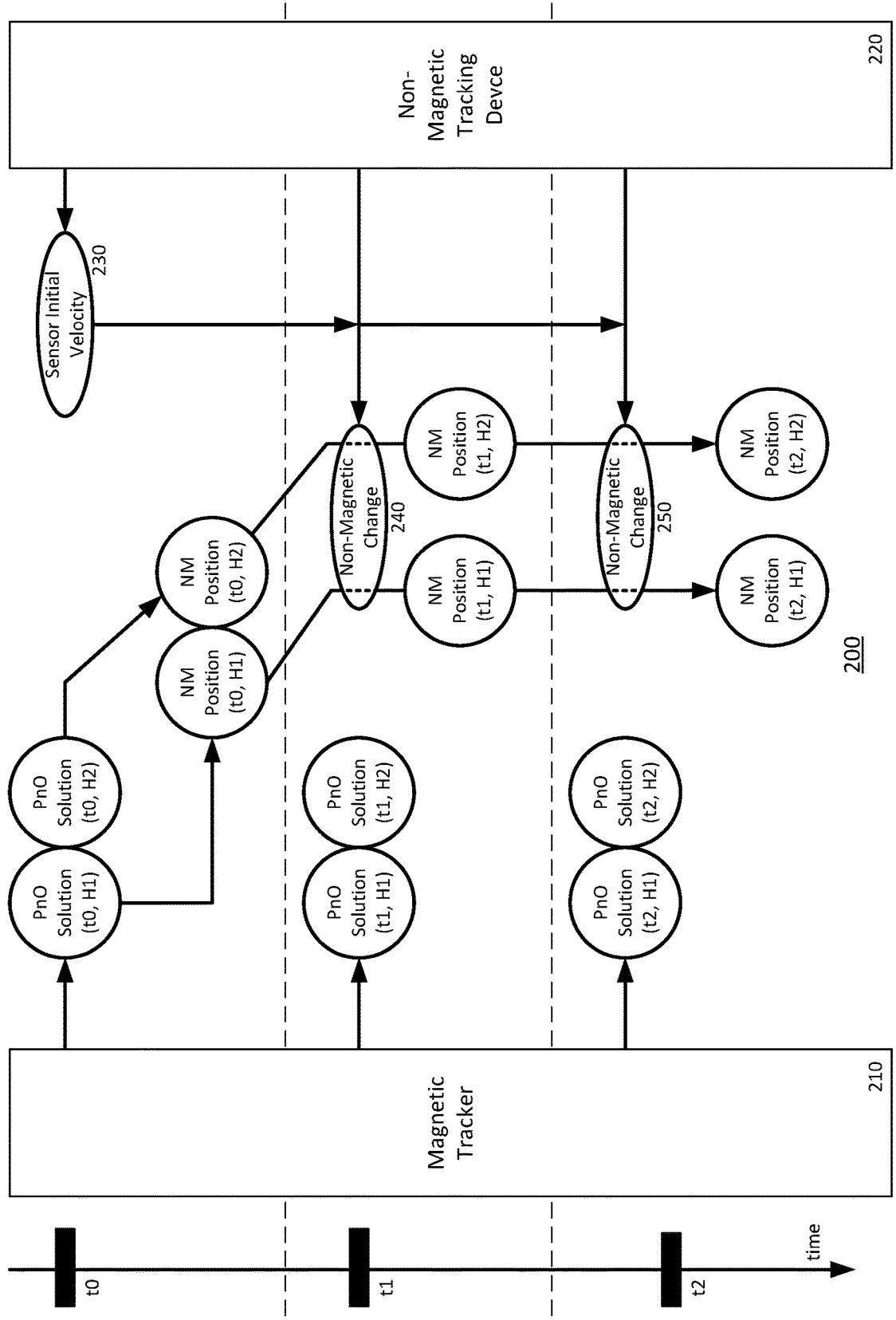
FIG. 2 is a diagram of an example data flow in accordance with an embodiment of the present disclosure.

FIG. 2 is a block diagram illustrating an example data flow in a system 200 of the present disclosure, such as the example system 100 of FIG. 1. The system 200 includes each of an electromagnetic tracking system 210 such as the transmitter 110 and receiver 120 of FIG. 1, a non-magnetic tracking system 220 having one or more non-magnetic tracking devices such as block 129 of FIG. 1. Although not shown, the system may also include one or more processors, such as the computing device 130 of FIG. 1, for processing the data received from the electromagnetic tracking system 210 and the non-magnetic tracking system 220.

The data flow in system 200 is shown at least partially in a chronological sequence in FIG. 2. For the sake of illustration, times t0, t1 and t2 are shown. Each of these times correspond to instances at which the electromagnetic tracking system 210 and the non-magnetic tracking system 220 obtain data. At the initial time t0, initial data is collected by each of the electromagnetic tracking system 210 and the non-magnetic tracking system 220. Then at subsequent times t1 and t2, further data is collected by each system 210, 220 to determine a PnO of the tracked object. As the tracked object moves, the determined PnO at each time may change.

In operation, at initial time t0, the electromagnetic tracking system 210 generates data signals indicative of a PnO of the tracked object. The data signals may be processed to determine a first PnO solution. Since it is unclear at this stage of the tracking which hemisphere of the tracking volume the tracked object is within, the first PnO solution may be designated by default as being in a first hemisphere. In FIG. 2, this is indicated by the notation "PnO Solution (t0, H1)" for the PnO solution obtained at time t0 within a first hemisphere. In other examples, the first PnO solution may be designated to a given hemisphere by a different rule or set of rules, such as being selected at random, being selected based on a hemisphere of the tracked object when the system was last used, and so on.

The data signals of the first PnO solution may also be used to determine a second PnO solution, shown as the "PnO Solution (t0, H2)" in FIG. 2. The second PnO solution may be selected such that it is opposite the first PnO solution along an axis of symmetry of the system's electromagnetic field. Each of the first PnO solution and the second PnO solution may be considered potentially valid positions of the sensor, since values derived from the electromagnetic data generated at the receiver coils can yield different solutions at opposite points of the tracking volume.

Also at time t0, in some examples, the non-magnetic tracking system 220 may register an initial velocity 230 of the tracked object. Such information may be useful in non-magnetic trackers that rely on sensed acceleration to determine motion of the tracked object, such as acceleration sensors and gyroscopic sensors. The initial velocity may then be used to track changes in motion of the object based on acceleration data sensed by the non-magnetic tracking system.

Any time including or after time t0 and before time t1, the system may further set first and second non-magnetic PnO values, NM Position (t0, H1) and NM Position (t0, H2). These values may be set to equal the first and second PnO solutions obtained at time t0. These initial "NM Position"

values may be determined and set independent of the non-magnetic tracking system 220, although the values may later be adjusted based on signals from the non-magnetic tracking system 220.

Next, at time t1, each of the electromagnetic tracking system 210 and the non-magnetic tracking system 220 may independently determine a PnO of the tracked object.

In the case of the electromagnetic tracking system 210, the PnO may be based entirely on newly generated data from the receiver coils at time t1. The data generated at time t1 may be used to derive two new first and second PnO solutions indicating respective candidate locations of the tracked object at time t1. These solutions are shown as PnO Solution (t1, H1) and PnO Solution (t1, H2) in FIG. 2. Like the first and second PnO solutions derived at time t0, these first and second PnO solutions are also located at opposite points of the tracking volume across the axis of symmetry of the electromagnetic field.

At all times, the two candidate PnO solutions determined at a given time are necessarily in opposite hemispheres from one another. It should be noted, though, that PnO Solution (t1, H1) is not required to be in the same hemisphere as PnO Solution (t0, H1), and that PnO Solution (t1, H2) is not required to be in the same hemisphere as PnO Solution (t0, H2). For instance, if the electromagnetic tracking system 210 detects that the tracked object switches between hemispheres between t0 and t1, then it would be expected that PnO Solution (t1, H1) is actually in the second hemisphere whereas PnO Solution (t1, H2) is in the first hemisphere. Thus, the "H1" and "H2" notation used in FIG. 2, is only meant to connote a hemisphere of the PnO solution at the initial time t0, and the actual hemisphere for each respective solution may change over time.

The non-electromagnetic tracking system 220 may track incremental changes 240 in position, orientation or both. For example, in the case of an inertial measurement unit (IMU) including accelerometers, gyroscopes or both, at time t1, the non-electromagnetic tracking system 220 may determine a change to a previous PnO based on changes in linear acceleration, angular acceleration, or both, of the tracked object between times t0 and t1. The changes in PnO may include a change in position, orientation or both. The previously entered first and second non-magnetic PnO values, NM Position (t0, H1) and NM Position (t0, H2) respectively, may be updated according to the tracked non-magnetic changes in PnO. The resulting non-magnetic PnO values are shown in FIG. 2 as "NM Position (t1, H1)" and "NM Position (t1, H2)," respectively.

The calculated values at time t1—PnO Solution (t1, H1), PnO Solution (t1, H2), NM Position (t1, H1) and NM Position (t1, H2)—can be used to evaluate each of the candidate PnO solutions and determine whether one of the solutions is the correct solution. This is performed by determining an amount of deviation for each candidate PnO solution against its corresponding non-magnetic solution, and determining which one of the candidate PnO solutions is diverging from its corresponding non-magnetic solution. In some instances, one candidate solution having a higher amount of deviation than the other solution may be indicative of one solution being correct since it tracks with the non-magnetic measurements while the other solution is incorrect since it does not track with the non-magnetic measurements.

Figure 3A:
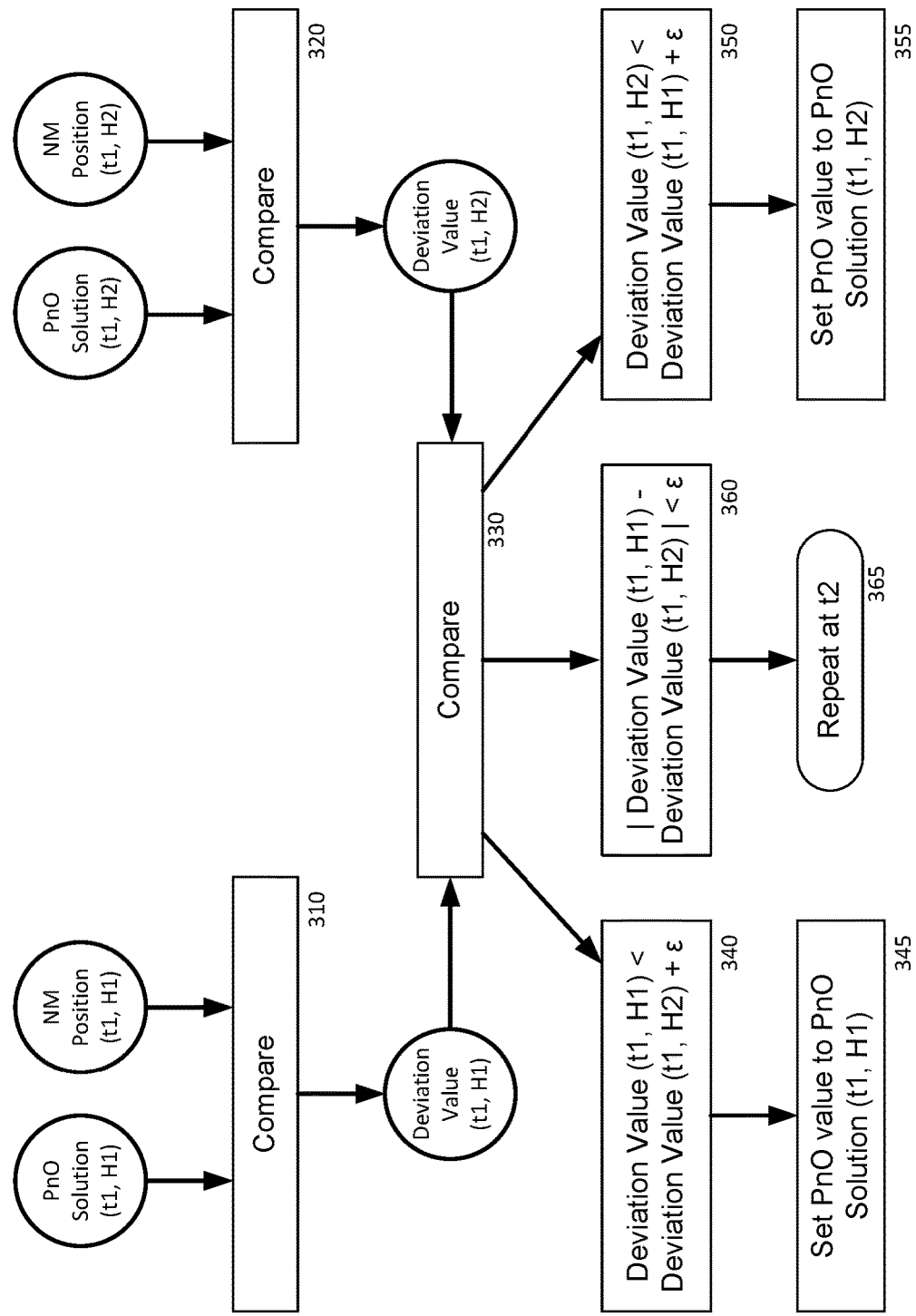
FIGS. 3A and 3B are functional diagrams of example calculations in accordance with embodiments of the present disclosure.

FIG. 3A is a functional diagram illustrating an example data flow 300 for such a calculation. The first PnO solution (PnO Solution (t1, H1)) and the first non-magnetic PnO value (NM Position (t1, H1)) are entered at block 310 and compared with one another. A first difference or deviation between these two values is output as Deviation Value (t1, H1). In a similar vein, the second PnO solution (PnO Solution (t1, H2)) and the second non-magnetic PnO value (NM Position (t1, H2)) are entered at block 320 and compared with one another. A second difference or deviation between these two values is output as Deviation Value (t1, H2). Next, the two Deviation Values are entered at block 330 and compared with one another. Any one of three types of results may be reached by the comparison at block 330:

(Result 1) At block 340, the Deviation Value (t1, H1) is less than the Deviation Value (t1, H2) by at least a predetermined threshold amount, which is represented in FIG. 3A as an error margin $\epsilon$. This result would indicate that PnO Solution (t1, H1) is correctly tracking with the measurements from the non-electromagnetic tracking system whereas PnO Solution (t1, H2) is not tracking with or even diverging from the measurements from the non-electromagnetic tracking system. As a result of this determination, at block 345, PnO Solution (t1, H1) may be selected and set as the correct PnO value of the system. Additionally, PnO Solution (t1, H2) may be deleted or discarded as a candidate PnO solution.

(Result 2) At block 350, the Deviation Value (t1, H2) is less than the Deviation Value (t1, H1) by at least the predetermined threshold amount $\epsilon$. This result would indicate that PnO Solution (t1, H2) is correctly tracking with the measurements from the non-electromagnetic tracking system whereas PnO Solution (t1, H1) is not tracking with or even diverging from the measurements from the non-electromagnetic tracking system. As a result of this determination, at block 355, PnO Solution (t1, H2) may be selected and set as the correct PnO value of the system. Additionally, PnO Solution (t1, H1) may be deleted or discarded as a candidate PnO solution.

(Result 3) At block 360, the comparison at block 330 is determined to be inconclusive, meaning that neither one of the Deviation Value (t1, H2) or the Deviation Value (t1, H1) is greater than or less than the other by at least the threshold amount $\epsilon$, or stated another way, an absolute value of the difference between the two Deviation Values is less than $\epsilon$. This can happen for any one of several reasons. For example, if the tracked object is stationary, then the respective non-magnetic PnO values may not change between times t0 and t1, meaning that NM Position (t1, H1) and NM Position (t1, H2) may be equal or close to equal. This would likely result in little to no deviation between the respective PnO solutions and their corresponding non-magnetic PnO values, meaning that both Deviation Values would be equal or close to 0. Thus, the difference between the Deviation Values would also be equal or close to 0.

For further example, if the tracked object is stationary but the non-electromagnetic tracking system is subject to drift, then the respective non-magnetic PnO values may change between times t0 and t1 but in the same direction. This would mean that both Deviation Values would be greater than 0, but by the same amount. Therefore, the difference between the Deviation Values would still be equal or close to 0. Thus, even when the non-electromagnetic tracking system is subject to drift, a candidate PnO solution would not be selected and the other solution discarded until the tracked object actually moves.

As a result of the inconclusive result at block 360, operations may be repeated at a future time. Turning back to FIG. 2, the future time is shown as time t2, during which each of the electromagnetic tracking system 210 and the non-magnetic tracking system 220 independently determine the PnO of the tracked object. The operations at time t2 are comparable to those of time t1, except that instead of receiving the first and second non-magnetic PnO values of time t0 and the initial velocity at time t0 as inputs, the operations at time t2 receive the adjusted first and second non-magnetic PnO values of time t1 and an adjusted velocity at time t1 (based on acceleration between t0 and t1) as inputs. Operations then proceed in the same manner, with new first and second PnO solutions (PnO Solution (t2, H1) and PnO Solution (t2, H2)) being generated by the magnetic tracking system 210 and each of the first and second non-magnetic PnO values obtained at time t1 being adjusted according to data received from the non-magnetic tracking system 220 in order to obtain first and second non-magnetic PnO values at time t2 (NM Position (t2, H1) and NM Position (t2, H2)). These values—PnO Solution (t2, H1), PnO Solution (t2, H2), NM Position (t2, H1) and NM Position (t2, H2)—can then be processed using the operations of FIG. 3A in the same or similar manner as described above for the values obtained at time t1. The process may repeat indefinitely until a correct PnO solution is selected from between the first PnO solution (the "H1" solutions) and the second PnO solutions (the "H2" solutions).

Figure 3B:
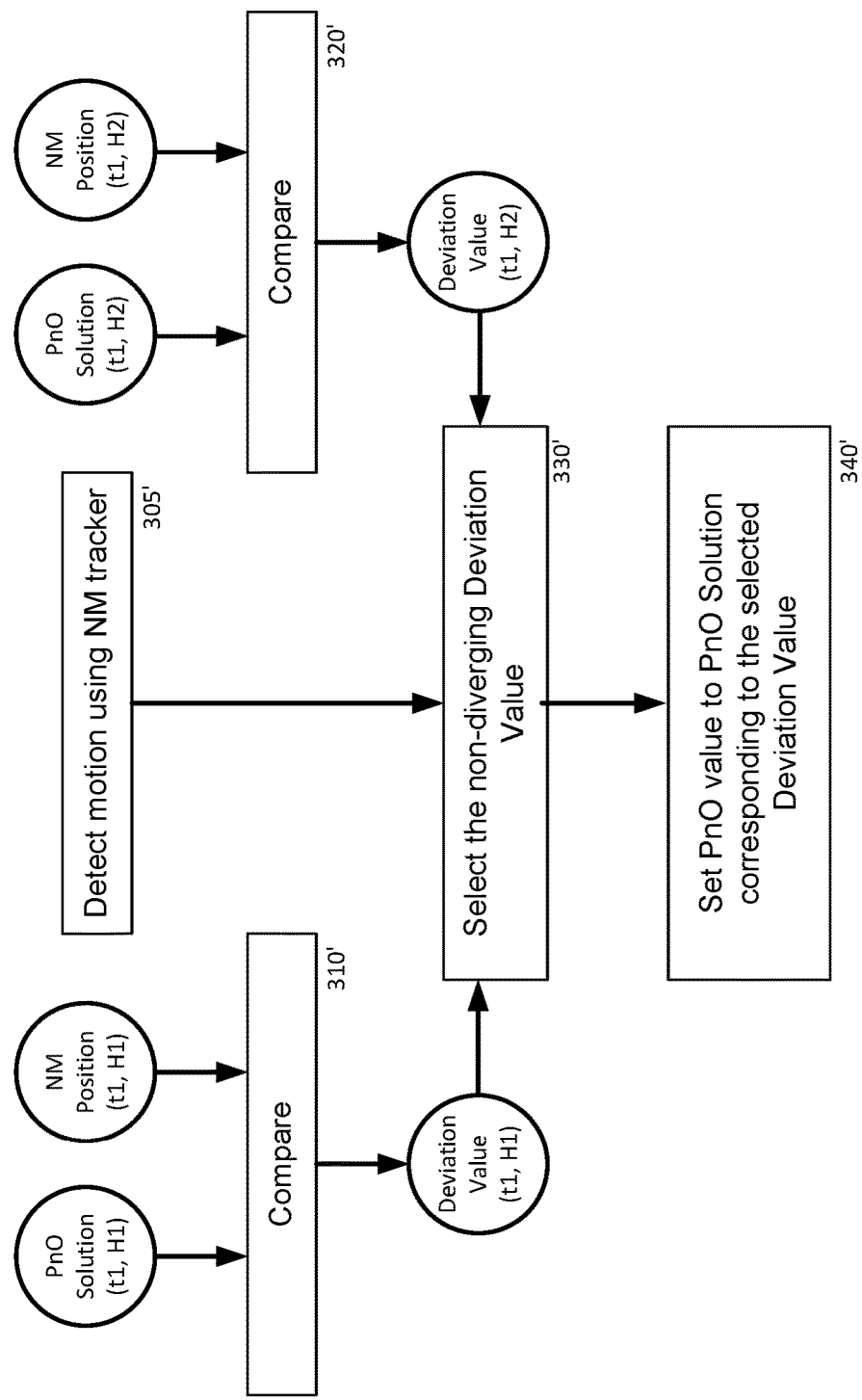

FIG. 3B is a functional diagram illustrating another example data flow 300' for determining which one of two candidate PnO solutions diverges from its corresponding non-magnetic solution. Like in the example of FIG. 3A, a first PnO solution (PnO Solution (t1, H1)) and a first non-magnetic PnO value (NM Position (t1, H1)) may be entered at block 310' and compared with one another to derive a calculated difference or deviation between these two values, shown as Deviation Value (t1, H1). Likewise, a second PnO solution (PnO Solution (t1, H2)) and a second non-magnetic PnO value (NM Position (t1, H2)) may be entered at block 320' and compared with one another to derive a calculated second difference or deviation between these two values, shown as Deviation Value (t1, H2). When the tracked object is in motion and the system is operating properly, only one of the two PnO solutions will diverge from its corresponding non-magnetic PnO value, meaning that only one of the two Deviation Values is expected to increase. As such, it may be determined which of the two calculated deviation values is a diverging Deviation Value, meaning that the Deviation Value is increasing due to the two solutions moving in opposite directions from one another. By extension, if one Deviation Value is known to be increasing, then this would mean that the other Deviation Value is a non-diverging Deviation Value, meaning that it is not increasing due to the two solutions moving in the same direction as one another. At block 330', the non-diverging Deviation Value may be selected, and at block 340', the PnO solution corresponding to the selected non-diverging Deviation Value may be set as the true PnO value.

Unlike the example data flow 300 of FIG. 3A, the example data flow 300' of FIG. 3B does not require a comparison between the two calculated Deviation Values. Instead, at least theoretically, a single Deviation Value could be examined and if it is determined that the Deviation Value is increasing, it could be determined that the PnO solution corresponding to the other Deviation Value is the correct PnO solution. Nonetheless, the data flow 300' may be designed to evaluate each of the two Deviation Values before identifying the correct, non-diverging Deviation Value, even if no comparison step is required.

In some instances, the example data flow 300' of FIG. 3B may be designed in a manner that does not check whether both Deviation Values are slowly diverging, such as due to drift in the non-magnetic position value while the tracked object remains still. One possible way to avoid misinterpreting the drift as an increasing Deviation Value is to delay the hemisphere selection performed by block 340' until after the object is known to have started moving. For instance, in the example data flow 300' of FIG. 3B, block 305' is added to require motion detection of the object before the non-diverging Deviation Value may be selected at block 330'. For example, the non-magnetic tracking system may be used to detect sudden changes in position or orientation, which in turn may be interpreted as motion of the tracked object. Once motion is detected, the likelihood of misinterpreting the Deviation Values due to drift decreases significantly or is completely avoided, and the PnO value may be set according to the non-diverging Deviation Value.

Figure 4:
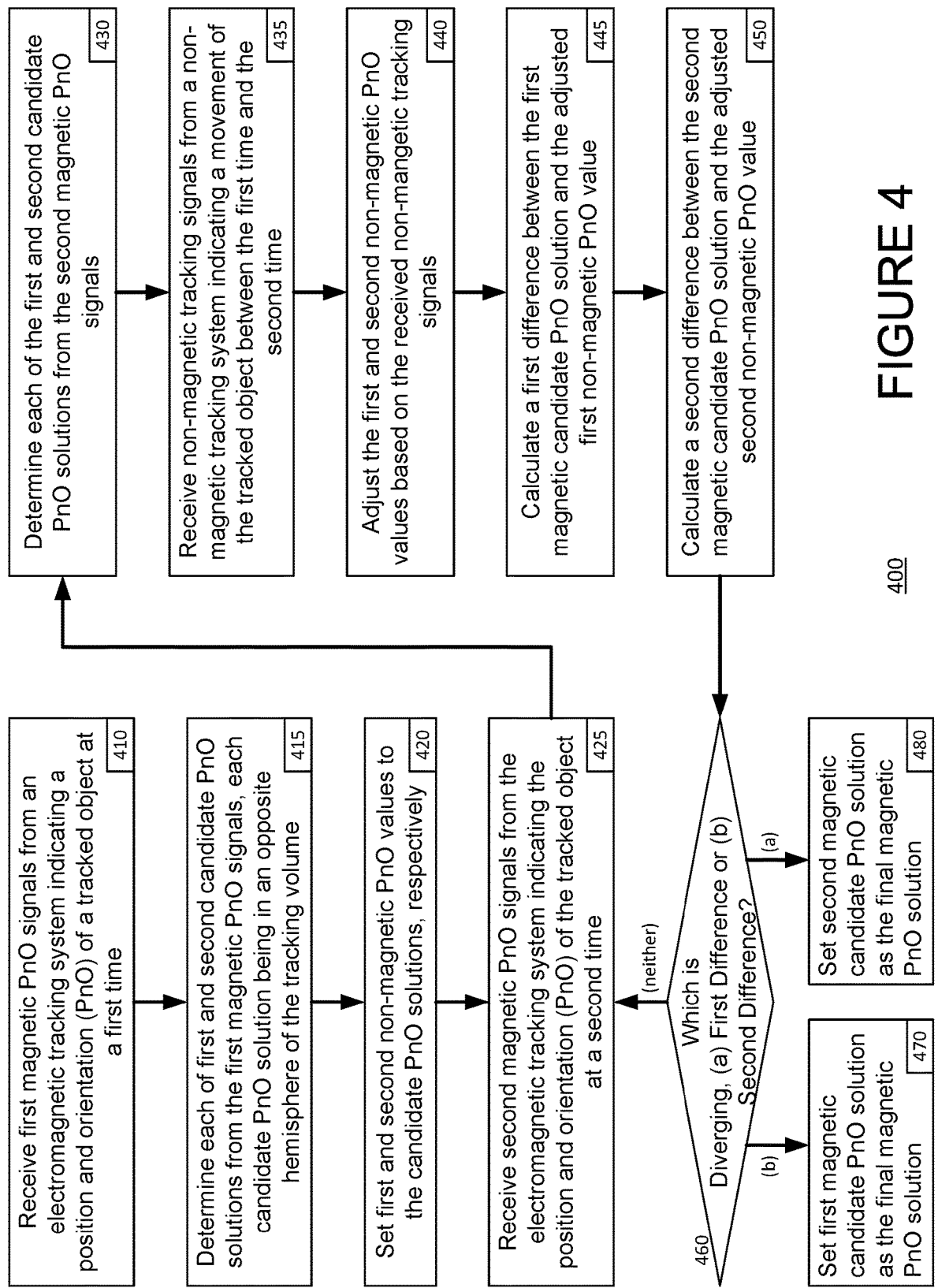
FIG. 4 is a flow diagram of an example routine in accordance with the embodiments of the present disclosure.

FIG. 4 is an example diagram showing an example routine 400 for resolving hemisphere ambiguity in an electromagnetic tracking system. At least some of the operations of routine 400 may be carried out by one or more processors of the computing device 130 shown in FIG. 1. It should be understood that in other example routines, steps may be added, subtracted, replaced, reordered, or performed at about the same time or in parallel.

At block 410, first magnetic PnO signals are received from the electromagnetic tracking system. The first magnetic PnO signals may be indicative of a position and an orientation of the tracked object. For instance, each magnetic PnO signal may represent a transmitted electromagnetic field between a given transmitter-receiver coil pair of the electromagnetic tracking system.

At block 415, each of first and second candidate PnO solutions are determined from the first magnetic PnO signals. For instance, the first magnetic PnO signals may be used to construct a signal matrix which may have multiple valid solutions. Each of the valid solutions may be in an opposite hemisphere of the tracking volume, and further may be opposite one another in the opposite hemispheres of the tracking volume. This means that if the tracked object begins to move in the tracking volume, one of the candidate solutions may indicate that the tracked object is moving to the left while the other candidate solution indicates that the tracked object is moving to the right. The magnetic PnO signals alone may be insufficient for disambiguation, meaning that further information may be needed in order to determine which of the valid candidate solutions is correct and which is incorrect, or in other words, to determine whether the tracked object is actually moving to the left or to the right.

At block 420, the first and second candidate PnO solutions are used to set two corresponding non-magnetic PnO values. For instance, if the first candidate PnO solution is a first set of coordinate values, the first non-magnetic PnO value may be set to the same first set of coordinate values. Likewise, if the second candidate PnO solution is a second set of coordinate values, the second non-magnetic PnO value may be set to the same second set of coordinate values. At this stage, the first and second "non-magnetic" PnO values are entirely based on magnetic PnO signals. However, they are referred to as "non-magnetic" PnO values because in later steps they will be adjusted according to non-magnetic tracking data.

At block 425, at a second instance in time after the first time, second magnetic PnO signals are received from the electromagnetic tracking system. The second magnetic PnO signals may indicate the PnO of the tracked object at the second time. First and second magnetic PnO signals may be obtained using the same techniques, but at different times.

Thus, the second magnetic PnO signals may be indicative of the same or a different position and an orientation of the tracked object as compared to the first magnetic PnO signals, depending on whether the tracked object has moved or remained stationary since the first time, respectively.

At block 430, each of first and second candidate PnO solutions are determined from the second magnetic PnO signals obtained at the second time. The first and second candidate PnO solutions at the second time may indicate two possible or candidate locations of the tracked object at the second time, whereby one location may be correct and one location may be incorrect.

At block 435, one or more non-magnetic tracking signals are received from the non-magnetic tracking system. The non-magnetic tracking signals may be generated at a same time that the second magnetic PnO signals of block 425 were generated, namely at the second time. Thus, the non-magnetic signals may indicate a movement of the tracked object between the first and second times. For instance, the non-magnetic tracking system may be an IMU, and may track translation and rotation of the tracked object. With knowledge of an initial velocity of the tracked object at the first time, the changes in acceleration may be used to calculate one or both of a linear or angular displacement of the tracked object.

At block 440, the one or more non-magnetic tracking signals may be used to adjust each of the first and second non-magnetic PnO values set at the first time. For each adjusted value, the adjustment may reflect a change in position, angle or both of the tracked object since the first time. Since each of the first and second non-magnetic PnO values are different from one another because they are located in different hemispheres of the tracking volume, making the same adjustment to each of the first and second non-magnetic PnO values necessarily results in the adjusted first and second non-magnetic PnO values also being different from one another. Just as one of the first and second non-magnetic PnO values is believed to correctly correspond with an original actual PnO of the tracked object at the first time while the other is believed to not match the original actual PnO, so too one of the adjusted first and second non-magnetic PnO values is believed to correctly correspond with the updated actual PnO of the tracked object at the second time while the other is believed to not correctly match the updated actual PnO.

The magnetic PnO data and non-magnetic PnO data is compared to one another in order to determine which of the two candidate PnO solutions is incorrect, thus rendering the other solution correct. For example, this may be done by tracking each updated PnO solution at the second time with its corresponding non-magnetic PnO value that it was used to set at the first time. In blocks 445 and 450, this is performed by calculating a first difference between the first magnetic candidate PnO solution determined based on the second magnetic PnO data signal and the adjusted first non-magnetic PnO value, and calculating a second difference between the second magnetic candidate PnO solution determined based on the second magnetic PnO data signal and the adjusted second non-magnetic PnO value, respectively. The first difference indicates how well the non-magnetic tracking signals obtained at block 435 track with the first PnO solutions determined at blocks 415 and 430. The second difference indicates how well the non-magnetic tracking signals obtained at block 435 track with the second PnO solutions determined at blocks 415 and 430.

At block 460, the first and second differences may be evaluated to determine which pair of candidate solutions represented by the differences is diverging. In some examples, the differences may be evaluated individually to determine which difference is increasing. In other examples, the differences may be compared with one another to determine which is greater and which is less. If one of the differences is greater than the other, this may be indicative of the non-magnetic tracking signals not tracking well with the corresponding candidate PnO solution. For instance, if the second difference is greater than the first difference, operations may continue at block 470, in which the first magnetic candidate PnO solution is determined to track better with the non-magnetic tracking signals than the second magnetic PnO solution, so the first magnetic candidate PnO solution is set as the final magnetic PnO solution. Conversely, if the first difference is greater than the second difference, operations may continue at block 480, in which the second magnetic candidate PnO solution is determined to track better with the non-magnetic tracking signals than the first magnetic PnO solution, so the second magnetic candidate PnO solution is set as the final magnetic PnO solution.

Alternatively, if neither of the first or second difference is greater or less than the other, this may be indicative that the tracked object has not moved, meaning that the non-magnetic tracking signals have not yet deviated from the first and second magnetic candidate PnO solutions. This may be true regardless of whether the first and second differences are large or small, whereby large differences may reflect drift or other types or causes of inaccuracy in the non-magnetic tracker. In such instances, more data may need to be gathered from the magnetic and non-magnetic tracking systems at a time during or after the tracked object is in motion. Therefore, operations return to block 425 with additional magnetic PnO signals being obtained at a subsequent third time, and with non-magnetic signals being obtained at the same third time.

The routine 400 may loop back to block 425 and repeat as many times as is necessary for a candidate PnO solution to be selected and for the other candidate PnO selection to be discarded. After the selection and discarding or the candidate solutions, the hemisphere of the tracked object has been determined and the routine 400 may end. Future magnetic PnO signals may be used to determine a PnO of the tracked object according to the determined hemisphere in which the tracked object began. Furthermore, the system may then use the selected candidate PnO solution as a final PnO solution whereby future measurements using the electromagnetic tracking system may rely solely on the final magnetic PnO solution. Additionally, the final magnetic PnO solution may be output as an indication of the position and orientation of the tracked object. Furthermore, future tracking of the object may involve outputting an indication of the position and orientation of the tracked object based on the determined starting hemisphere of the tracked object as indicated by the final magnetic PnO solution.

The example routine 400 of FIG. 4 generally describes selecting one of the two candidate solutions when the other solution is large, or when one solution is larger or smaller than the other. In some examples, as noted in connection with FIG. 3A, this decision may be preconditioned on a threshold amount, so that only a significant difference between the first and second differences results in disambiguation. The threshold amount may vary depending on the particular tracking systems being used. In some cases, the threshold amount may be an absolute amount, although in other cases it may be a rate over a duration of time. In any of the examples, the threshold amount may be sufficient to distinguish noise or drift in tracking systems from actual motion of the tracked object.

The result of the routine 400 is an automated determination of which hemisphere the tracked object begins at the first time. No information about the location of the tracked object or the tracking volume needs to be entered manually in order to achieve disambiguation. Furthermore, there is no opportunity for manually entered information to be entered incorrectly, meaning that the disambiguation result has improved reliability. Additionally, by tracking two different candidate solutions against the non-magnetic tracking data, it can be determined when one candidate solution begins to diverge from the non-magnetic tracking data more than the other solution, thus avoiding incorrect determinations due to incorrect or drifting non-magnetic data.

Additionally, the above examples generally describe a system deriving a PnO of a tracked object from the electromagnetic tracking system only, and using the non-magnetic tracking system only to check accuracy of the electromagnetic tracking data and resolve hemisphere ambiguity. However, in other examples, the non-magnetic tracking system can be used to derive the PnO of the tracked object in combination with or in place of the electromagnetic tracking system. For instance, if it is determined that the PnO data is unreliable, then it may be preferable to rely on a system other than the electromagnetic tracking system in order to determine the PnO of the tracked object. In such an instance, and if the non-electromagnetic tracking system provides sufficient motion data for determining PnO of the tracked object, then the one or more processors can determine to use the motion data from the non-magnetic tracking system to determine PnO in place of the PnO data from the electromagnetic tracking system. For instance, the data may be combined using a Kalman filter. Combining magnetic and non-magnetic data may begin before hemisphere disambiguation, whereby the magnetic and non-magnetic data can separately be evaluated in the manner described above.

In other instances, under similar circumstances, the one or more processors may use a combination of PnO data and motion data. The data may be combined using techniques known in the art, such as additional filters and filtering routines. In operation, filtering may involve weighting the PnO and motion data based on detected properties of the data, such as noise, magnetic distortion, rate of change (such as a change in velocity) or other measurable quantities. Additionally or alternatively, filtering operations may rely on motion models, take into account error covariance, or both, in order to evaluate the received data from the various sensor sources and to identify patterns in the data that may indicate the presence of errors for one or a combination of sensor sources, an absence of errors for one or a combination of sensors sources, or both.

The example electromagnetic tracking devices, systems and methods described above may be useful in several applications, including head-mounted displays (HMD), devices for surgical navigation (including simulations of surgical procedures), handheld or wearable devices for virtual reality or augmented reality programs, and more. Generally, in such applications, the receiver circuit is mounted to a tracked object, such as a user's helmet or a surgical device, and the transmitter circuit is mounted to a fixed platform, such as a tripod positioned close to the user, or to a frame of a vehicle of the user for applications in which the user is traveling. However, due to the reciprocal nature of electromagnetic tracking systems, the transmitter circuit may alternatively be mounted to the moving object and the receiver circuit to the fixed platform. In this manner, in instances where connecting the computing device to the receiver circuit may be difficult for a receiver circuit mounted to a tracked object, it may be possible instead to mount the receiver circuit to the fixed object or vehicle frame.

The above examples also generally describe a system using a receiving coil array including coils in order to detect the magnetic field generated by the transmitter circuit and generate the electrical signals. However, in other examples, the receiver circuit may include an array of sensing elements other than coils. For example, the receiver circuit may include an array of Hall effect sensing elements. It should be understood that the receiver coils of any of the above examples and embodiments may be replaced with the alternative receiver elements without changing the underlying nature of the systems and methods.

Although the present disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A method for tracking a position and orientation (PnO) of a first object within a tracking environment according to a first frame of reference defined by a second object, the method comprising:

(a) receiving, by one or more processors, one or more first magnetic PnO data signals from a magnetic tracking subsystem;

(b) determining, by the one or more processors, each of a first magnetic candidate PnO solution and a second magnetic candidate PnO solution of the first object within the tracking environment based on the first magnetic PnO data signal;

(c) setting, by the one or more processors, a first non-magnetic PnO value to correspond to the first magnetic candidate PnO solution and a second non-magnetic PnO value to correspond to the second magnetic candidate PnO solution;

(d) after setting the first and second non-magnetic PnO values, receiving, by the one or more processors, each of: (i) one or more second magnetic PnO data signals from the magnetic tracking subsystem and (ii) one or more non-magnetic tracking signals from a non-magnetic tracking subsystem indicative of a movement of the first object within the tracking environment according to a second frame of reference;

(e) determining, by the one or more processors, each of the first magnetic candidate PnO solution and the second magnetic candidate PnO solution of the first object within the tracking environment based on the second magnetic PnO data signal;

(f) adjusting, by the one or more processors, each of the first and second non-magnetic PnO values based on the one or more non-magnetic tracking signals;

(g) calculating, by the one or more processors, a first difference between the first magnetic candidate PnO solution determined based on the second magnetic PnO data signal and the adjusted first non-magnetic PnO value;

(h) calculating, by the one or more processors, a second difference between the second magnetic candidate PnO solution determined based on the second magnetic PnO data signal and the adjusted second non-magnetic PnO value;

(i) determining, by the one or more processors, which of the first difference or the second difference is indicative of divergence between its respective magnetic candidate PnO solution and non-magnetic PnO value; and (j) setting, by the one or more processors, a final magnetic PnO solution of the first object:

to the first magnetic candidate PnO solution in response to the second difference being indicative of divergence between the second magnetic candidate PnO solution and the adjusted second non-magnetic PnO value; or to the second magnetic candidate PnO solution in response to the first difference being indicative of divergence between the first magnetic candidate PnO solution and the adjusted first non-magnetic PnO value.

2. The method of claim 1, further comprising:

determining, by the one or more processors, whether the first object is stationary or in motion at a time associated with the one or more first magnetic PnO data signals; and either:

in response to determining that the first object is stationary, setting, by the one or more processors, an initial velocity of the first object at zero; or in response to determining that the first object is in motion, setting, by the one or more processors, the initial velocity of the first object based on the one or more non-magnetic tracking signals.

3. The method of claim 2, wherein adjusting each of the first and second non-magnetic PnO values comprises:

determining at least one of a linear motion or an angular motion of the first object based on the one or more non-magnetic tracking signals and the set initial velocity; and adjusting each of the first and second non-magnetic PnO values based on the determined linear motion and/or angular motion, wherein each of the first and second non-magnetic PnO values is adjusted by a same amount.

4. The method of claim 1, wherein the first magnetic candidate PnO solution and the second magnetic candidate PnO solution are coordinates in opposite hemispheres of the tracking environment.

5. The method of claim 1, wherein determining which of the first difference or the second difference is indicative of diverging magnetic candidate PnO solution and non-magnetic PnO values comprises determining which of the first difference or the second difference is increasing.

6. The method of claim 5, further comprising, detecting motion of the first object based on the one or more non-magnetic tracking signals, wherein calculating the first difference and the second difference is performed after motion of the first object is detected.

7. The method of claim 1, wherein determining which of the first difference or the second difference is indicative of diverging magnetic candidate PnO solution and non-magnetic PnO values comprises determining which of the first difference or the second difference is greater, and wherein the final magnetic PnO solution of the first object is set:

to the first magnetic candidate PnO solution in response to the second difference being greater than the first difference; or to the second magnetic candidate PnO solution in response to the first difference being greater than the second difference.

8. The method of claim 7, wherein the final magnetic PnO solution of the first object is set: (i) to the first magnetic candidate PnO solution in response to the second difference being greater than or equal to the first difference by a threshold amount, or (ii) to the second magnetic candidate PnO solution in response to the first difference being greater than or equal to the second difference by the threshold amount.

9. The method of claim 8, further comprising repeating, by the one or more processors, steps (d)-(j) in response to an absolute value of the first and second differences being less than the threshold amount.

10. The method of claim 1, wherein the one or more non-magnetic tracking signals are indicative of at least one of a translation or rotation of the first object relative to the second object.

11. The method of claim 1, wherein the one or more non-magnetic tracking signals are received from one of: an inertial sensor, an optical sensor, an acoustic sensor, a radio frequency (RF) sensor, a barometer, a GPS receiver, a radar chip, or a magnetometer.

12. The method of claim 1, further comprising outputting the final magnetic PnO solution of the first object.

13. The method of claim 1, wherein each of the first magnetic PnO data signals and the second magnetic PnO data signals are received from a plurality of sensing elements of the electromagnetic tracking system operative to detect magnetic fields emitted by a plurality of transmission coils of the electromagnetic tracking system along different axes.

14. The method of claim 13, further comprising:

emitting, by the plurality of transmission coils of the electromagnetic tracking system, respective magnetic fields; and detecting, by the plurality of sensing elements of the electromagnetic tracking system, the emitted magnetic fields.

15. An apparatus for tracking a position and orientation (PnO) of a first object within a tracking environment according to a first frame of reference defined by a second object, the apparatus comprising:

memory for storing instructions; and one or more processors for executing the instructions, wherein the instructions stored in the memory are configured to cause the one or more processors to:

receive one or more first magnetic PnO data signals from a magnetic tracking subsystem;

determine each of a first magnetic candidate PnO solution and a second magnetic candidate PnO solution of the first object within the tracking environment based on the first magnetic PnO data signal;

set a first non-magnetic PnO value to correspond to the first magnetic candidate PnO solution and a second non-magnetic PnO value to correspond to the second magnetic candidate PnO solution;

after setting the first and second non-magnetic PnO values, receive each of: (i) one or more second magnetic PnO data signals from the magnetic tracking subsystem and (ii) one or more non-magnetic tracking signals from a non-magnetic tracking subsystem indicative of a movement of the first object within the tracking environment according to a second frame of reference;

determine each of the first magnetic candidate PnO solution and the second magnetic candidate PnO solution of the first object within the tracking environment based on the second magnetic PnO data signal;

adjust each of the first and second non-magnetic PnO values based on the one or more non-magnetic tracking signals;

calculate a first difference between the first magnetic candidate PnO solution determined based on the second magnetic PnO data signal and the adjusted first non-magnetic PnO value;

calculate a second difference between the second magnetic candidate PnO solution determined based on the second magnetic PnO data signal and the adjusted second non-magnetic PnO value;

determine which of the first difference or the second difference is indicative of divergence between its respective magnetic candidate PnO solution and non-magnetic PnO value; and set a final magnetic PnO solution of the first object: (i) to the first magnetic candidate PnO solution in response to the second difference being indicative of divergence between the second magnetic candidate PnO solution and the adjusted second non-magnetic PnO value, or (ii) to the second magnetic candidate PnO solution in response to the first difference being indicative of divergence between the first magnetic candidate PnO solution and the adjusted first non-magnetic PnO value.

16. The apparatus of claim 15, wherein the instructions are further configured to cause the one or more processors to:
determine a motion of the first object at a time associated with the one or more first magnetic PnO data signals; and
set an initial velocity of the first object based on the determined motion of the first object.

17. The apparatus of claim 15, wherein the first magnetic candidate PnO solution and the second magnetic candidate PnO solution are coordinates in opposite hemispheres of the tracking environment.

18. The apparatus of claim 15, wherein the instructions are further configured to cause the one or more processors to determine which of the first difference or the second difference is increasing.

19. The apparatus of claim 18, wherein the instructions are further configured to cause the one or more processors to detect motion of the first object based on the one or more non-magnetic tracking signals, and calculate the first difference and the second difference after motion of the first object is detected.

20. The apparatus of claim 15, wherein the instructions are further configured to cause the one or more processors to determine which of the first difference or the second difference is greater, wherein the final magnetic PnO solution of the first object is set to the first magnetic candidate PnO solution in response to the second difference being greater than the first difference, and to the second magnetic candidate PnO solution in response to the first difference being greater than the second difference.

21. The apparatus of claim 15, wherein the instructions are configured to cause the one or more processors to set the final magnetic PnO solution:
to the first magnetic candidate PnO solution in response to the second difference being greater than or equal to the first difference by a threshold amount; or
to the second magnetic candidate PnO solution in response to the first difference being greater than or equal to the second difference by the threshold amount.

22. The apparatus of claim 21, wherein the instructions are configured to repeatedly:
receive new magnetic PnO data signals and non-magnetic tracking signals, calculate the first and second differences based on the received new magnetic PnO data signals and non-magnetic tracking signals, and determine which of the first difference or the second difference is greater until the absolute value of the first and second differences is greater than or equal to the threshold amount.

23. The apparatus of claim 15, wherein the one or more non-magnetic tracking signals are indicative of at least one of a translation or rotation of the first object relative to the second object.

24. The apparatus of claim 15, further comprising:
the non-magnetic tracking subsystem;
a receiver circuit including a plurality of receiver elements aligned at different receiver axes, each receiver element configured to detect a magnetic field along its respective axis; and
a transmitter circuit including a plurality of transmission elements aligned at different transmitter axes, each transmission coil configured to emit a magnetic field along its respective axis, wherein the plurality of receiver elements are operative to detect magnetic fields emitted by the transmission coils along their respective axes and generate corresponding magnetic PnO data signals for each component of the detected magnetic field.

25. The apparatus of claim 24, wherein the non-magnetic tracking device is one of: an inertial sensor, an optical sensor, an acoustic sensor, a radio frequency (RF) sensor, a barometer, a global positioning system (GPS) receiver, a radar chip, or a magnetometer.

26. The apparatus of claim 25, wherein the non-magnetic tracking subsystem includes a first component freely moving with the first object, and a second component having a known position relative to the second object.

27. The apparatus of claim 25, wherein at least one element of the non-magnetic tracking subsystem is mechanically coupled to either the receiver circuit or the transmitter circuit.

* * * * *